United States Patent
Mishima

[11] Patent Number: 6,151,121
[45] Date of Patent: Nov. 21, 2000

[54] POSITION DETECTING SYSTEM AND DEVICE MANUFACTURING METHOD USING THE SAME

[75] Inventor: Kazuhiko Mishima, Utsunomiya, Japan

[73] Assignee: Canon Kabushiki Kaisha, Tokyo, Japan

[21] Appl. No.: 09/238,508

[22] Filed: Jan. 27, 1999

[30] Foreign Application Priority Data

Jan. 29, 1998 [JP] Japan .................................. 10-032142

[51] Int. Cl.⁷ .................................................. G01B 11/00
[52] U.S. Cl. ........................................ 356/399; 356/400
[58] Field of Search ..................... 356/399–401

[56] References Cited

U.S. PATENT DOCUMENTS

| | | | |
|---|---|---|---|
| 4,880,308 | 11/1989 | Shirasu | 356/401 |
| 5,272,501 | 12/1993 | Nishi et al. | 355/53 |
| 5,883,701 | 3/1999 | Hasegawa et al. | 355/53 |

*Primary Examiner*—Frank G. Font
*Assistant Examiner*—Michael P. Stafira
*Attorney, Agent, or Firm*—Fitzpatrick, Cella, Harper & Scinto

[57] ABSTRACT

A position detecting system for detecting a relative position of first and second objects placed in an optically conjugate relation with respect to a projection optical system includes a pulse light source, a photoelectric detector and a controller. The pulse light source emits pulse light for illuminating a first mark provided on the first object and a second mark provided on one of the second object and a reference plate disposed at a position equivalent to that of the second object. The photoelectric detector photoelectrically detects the first and second marks illuminated with the pulse light from the pulse light source. The controller controls the number of pulses of the pulse light from the pulse light source, in the photoelectric detection of the first and second marks through the photoelectric detector.

20 Claims, 10 Drawing Sheets

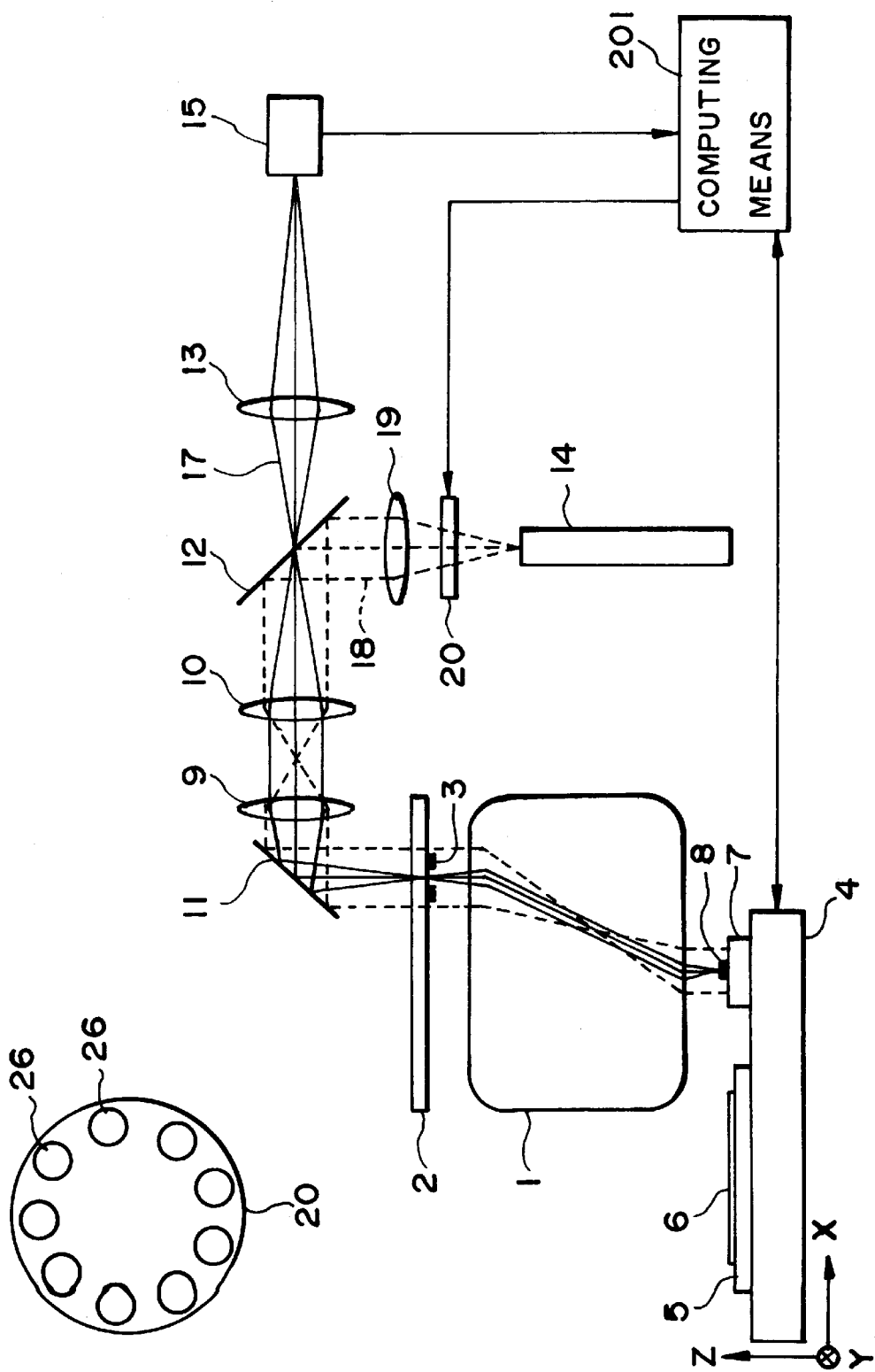
F I G. 3

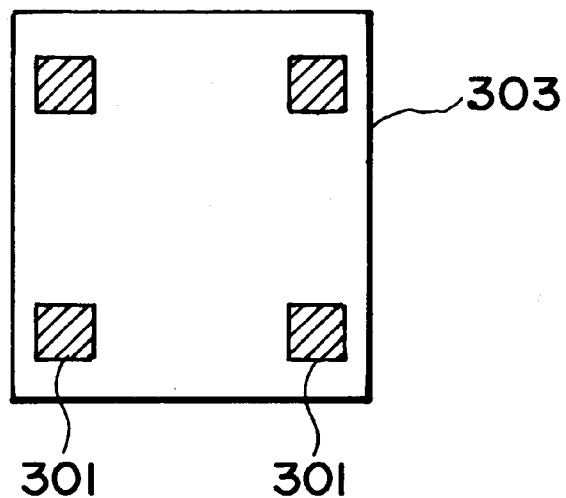
F I G. 4A
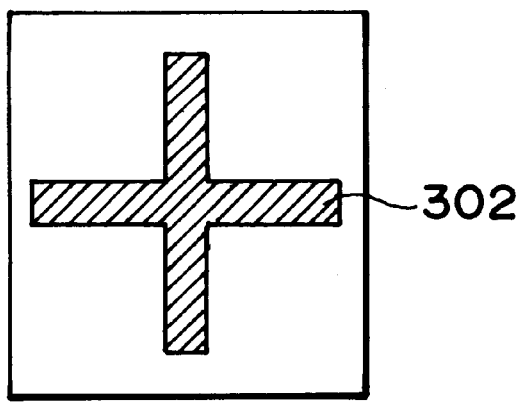
F I G. 4B

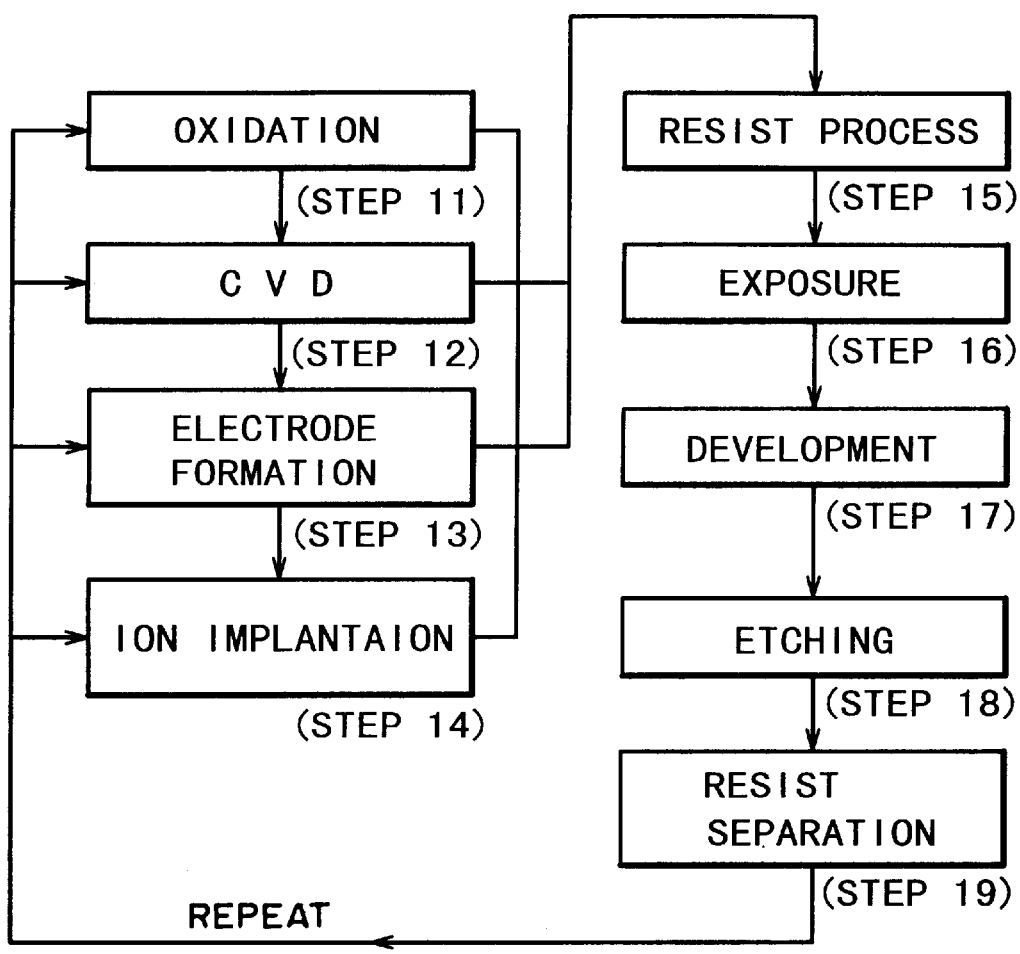
FIG. II

POSITION DETECTING SYSTEM AND DEVICE MANUFACTURING METHOD USING THE SAME

FIELD OF THE INVENTION AND RELATED ART

This invention relates to a position detecting system using pulse light as a light source, and to a device manufacturing method using the same. The present invention is particularly suitably applicable to an alignment system in a projection exposure apparatus for producing microdevices such as semiconductor chips (e.g., IC or LSI), CCDs, liquid crystal panels or magnetic heads, for example, for detecting positional information about an object such as a mask or wafer through observation of an image of such an object and for aligning the object on the basis of the positional information.

Semiconductor device manufacturing technology has been advanced remarkably and, in relation to it, microprocessing techniques have been improved notably. In an optical processing technique which is in the mainstream thereof, reduction projection exposure apparatuses (steppers) having a resolution of a submicron order are used dominantly. Enlargement of the numerical aperture (NA) of an optical system or reduction of the wavelength of exposure light are being attempted for further improvement of resolution.

In the stream of reduction of the wavelength of exposure light, exposure light sources have been changed from ultra-high pressure Hg lamps of g-line or i-line to KrF and also to ArF excimer lasers.

Improvements of resolution for a projected pattern have required higher precision of alignment for relatively aligning a wafer and a mask (reticle). A projection exposure apparatus should be a high resolution exposure apparatus and, on the other hand, it should have a function of a high precision position detecting system. Furthermore, for transfer of a pattern of a reticle to a wafer, a high resolution exposure apparatus should detect a focus position of a projection optical system very precisely.

Here, in a narrow sense, the position detection refers to alignment detection while, in a broad sense, the position detection refers to alignment detection and focus position detection.

One form of a position detecting system is called "Through The Reticle Autoalignment" (TTR-AA) wherein an alignment mark provided on a reticle and an alignment mark provided on a wafer (photosensitive substrate) or on a stage for carrying. the photosensitive substrate thereon are directly registered with each other, by which relative position of them is detected.

An example of such a TTR-AA system will be explained with reference to FIG. 3. Illumination light 18 emitted from a light source 14 (e.g., an Hg lamp in a case of exposure light, or a halogen lamp in a case of non-exposure light) goes through a light quantity attenuator 20 (e.g., an ND filter) and then through an illumination system 18. After this, it is reflected by a beam splitter 12 toward a detection optical system 9 and 10. The light passing through the detection optical system 9 and 10 Koehler-illuminates a mark region 3 of a reticle 2. Reflected light, scattered light or diffracted light 17 from the mark region 3, formed on the pattern surface of the reticle 2 again passes through the detection optical system 9 and 10, and it goes through the beam splitter 12. Then, by means of an imaging optical system 13, it is projected on a photoelectric converting element 15 such as a CCD camera, for example. Upon the tube surface (image pickup surface) of the photoelectric converting element 15, an image of the mark 3 (hereinafter "reticle alignment mark") on the pattern surface of the reticle 2 is imaged.

On the other hand, light impinging on a region other than the reflective surface region (pattern region) of the mark 3 of the reticle 2 goes through the reticle and then through a projection optical system 1, and similarly it Koehler-illuminates an alignment mark 8 (hereinafter "wafer alignment mark") which is provided on a movable wafer stage 4. The alignment mark 8 is patterned upon a reference plate 7 mounted on the wafer stage 4. For alignment of a wafer 6, the alignment mark 8 provided on the wafer 6 is illuminated.

Reflected light, scattered light or diffracted light produced by illumination of the wafer alignment mark 8 goes through the projection optical system 1, and it is imaged upon the pattern surface of the reticle 2. Similarly, an image of the wafer alignment mark 8 is imaged upon the photoelectric converting element 15 along the same light path as the reticle alignment mark 3. On the basis of signals for the wafer alignment mark 8 and the reticle alignment mark 3 of the reticle 2, obtainable from the photoelectric converting element 15, the relative position of them is calculated. On the basis of the result of calculation, the wafer stage 4 is moved in X, Y and/or Z directions to provide the best registration of patterns of the reticle 2 and the wafer 6. Then, by means of an exposure illumination system (not shown) disposed above the reticle 2, a circuit pattern of the reticle 2 is sequentially printed on a wafer 6.

For measurement of a focus position of the projection optical system 1, images of the reticle alignment mark 3 and the wafer alignment mark 8, being imaged through the above-described optical system, are detected by the photoelectric converting element 15 and, on the basis of an image contrast of them obtained thereby, the focus position of the projection optical system is detected.

FIG. 8 illustrates, in a schematic graph, changes of image contrast obtainable from the photoelectric converting element, as the wafer alignment mark 8 is displaced along an optical axis direction of the projection optical system 1. The image contrast of the wafer alignment mark 8 varies with movement of the wafer alignment mark 8 along the optical axis direction of the projection optical system 1, and it becomes highest at a conjugate plane (best focus plane BF) with the reticle 3 through the projection optical system 1.

On the other hand, for detection of image contrast of the wafer alignment mark 8, the focus position of the detection optical system itself must be in an optimum state with respect to the reticle alignment mark 3. To this end, the image contrast of the reticle alignment mark 3 is detected in accordance with the same principle as the focus measurement for the wafer alignment mark 8, and the focus setting of the detection optical system is performed. More specifically, for example, the detection optical system 10 is held fixed at a best focus position as can be calculated from a contrast curve which is obtainable by moving the detection optical system 10 in the focus direction. Once the detection optical system is placed in a best set state with respect to the reticle, then measurement of wafer alignment mark 8 in the focus direction can be performed.

SUMMARY OF THE INVENTION

However, in simultaneous observation of reticle alignment mark 3 and wafer alignment mark 8 with one and the same photoelectric converting element as described above, high precision detection could not be attained unless these mark images have brightness in a certain range.

FIG. 4A shows an example of reticle alignment mark 3 on a reticle, and FIG. 4B shows an example of wafer alignment mark 8 on a wafer stage 4. In FIG. 4A, the mark on the reticle is provided such as depicted at 301: that is, there are marks placed at four corners in a mark region 303, for allowing simultaneous observation in X and Y directions through the projection exposure apparatus.

In FIG. 4B, the wafer alignment mark 8 is provided by a cross-shaped mark 302, for allowing observation thereof through a void region of the reticle alignment mark 301. These marks can be observed simultaneously through the above-described position detecting system.

FIG. 5A illustrates the result of simultaneous observation of the wafer alignment mark 302 and the reticle alignment mark 301. On the basis of such simultaneous observation, the relative position of them can be calculated. Further, the focus measurement for the projection optical system 1 can be made in accordance with image contrast of the alignment marks 301 and 302.

Generally, a signal of wafer alignment mark 302 is lower as compared with the reticle alignment mark 301, because there is a reduction of the light quantity due to passage of light through the projection optical system 1. FIGS. 5B through 5D show signal waveforms in a horizontal direction, for explaining this. A normal and optimum signal intensity is illustrated in FIG. 5C, and the light quantity attenuator 20 provided in the detection optical system is adjusted so that signals of the reticle and wafer marks can be detected in a certain intensity range. The light quantity attenuator 20 comprises ND filters mounted on a rotary plate. An appropriate ND filter is inserted to the optical axis by rotation, to adjust the light quantity.

If the light quantity is large as shown in FIG. 5B, the signal of the reticle alignment mark 301 about a peak thereof is saturated, and high precision detection of the reticle alignment mark 301 ends in failure. On the other hand, if the light quantity is small as shown in FIG. 5D, the intensity of the signal of wafer alignment mark 302 becomes low and, in this case, it causes degradation of the detection precision for the wafer alignment mark 302.

An attempt to solve this problem may be separate detection of the marks. For example, in FIG. 5B, only the wafer alignment mark 302 is detected and, thereafter, while changing the light quantity attenuator 20 into the FIG. 5D state, only the reticle alignment mark 301 is detected. Then, through calculation, the relative position of them is detected.

However, if the light quantity attenuator 20 is to be changed for light quantity adjustment, the changing requires a substantial time. Particularly, if the light quantity attenuator 20 comprises interchangeable ND filters such as described above, a very long time is necessary for the replacement, and it results in a decrease of throughput.

Moreover, because the optimum light quantity range is limited, for improvement of resolution of the light quantity adjustment, the number of types of ND filters used should be enlarged. For example, if the optimum light quantity range is 70% and when the light quantity adjustment should be made from 100% to 6%, it is necessary to use nine different ND filters of 100%, 70%, 50%, 34%, 24%, 17%, 12%, 8.4%, and 6%. This leads to enlargement in the size of the apparatus.

Another attempt may be that, when a light source of a continuous light such as a Hg lamp, halogen lamp, or He—Ne laser is used, on/off control or quantity adjustment of the light is made within the taking-in time of the photoelectric converting element, by use of a mechanical light blocking member such as a shutter or through electric current control. However, such control requires high speed changing because of limitations of time, and practically it is very difficult to accomplish.

It is an object of the present invention to provide a position detecting system and/or a device manufacturing method using the same, by which the precision can be improved while enlarging the dynamic range of the light quantity adjusting function.

It is another object of the present invention to provide a position detecting system and/or a device manufacturing method using the same, by which enlargement of the structure is prevented or reduced.

It is a further object of the present invention to provide a position detecting system and/or a device manufacturing method using the same, by which an adverse effect to throughput is prevented or reduced.

In accordance with an aspect of the present invention, there is provided a position detecting system for detecting a relative position of first and second objects placed in an optically conjugate relation with respect to a projection optical system, comprising: a pulse light source for emitting pulse light for illuminating a first mark provided on the first object and a second mark provided on one of the second object and a reference plate disposed at a position equivalent to that of the second object; a photoelectric detector for photoelectrically detecting the first and second marks illuminated with the pulse light from said pulse light source; and control means for controlling the number of pulses of the pulse light from said pulse light source, in the photoelectric detection of the first and second marks through said photoelectric detector.

The number of pulses may not be less than a minimum number of pulses with which no measurement error is produced in the relative position detection due to speckle to be produced by the pulse light.

The control of the pulse number may be made by changing a pulse light emission frequency within a taking-in time of said photoelectric detector.

The control of the pulse number may be made by changing a taking-in time of said photoelectric detector.

For changing the taking-in time, said pulse light source may be oscillated at a highest light emission frequency of said pulse light source.

The position detecting system may further comprise light quantity adjusting means separate from said control means, wherein said light quantity adjusting means may be used in combination with the pulse number control through said control means.

The light quantity adjusting means may comprise a selection of plural ND filters.

The position detecting system may further comprise a second photoelectric detector for monitoring a quantity of light to said first-mentioned photoelectric detector.

The control of the pulse number may be made on the basis of an output of said second photoelectric detector.

The detection of the relative position may concern detection of an alignment state of the first and second objects with respect to the projection optical system.

The detection of the relative position may concern detection of a focus state of the first and second objects with respect to the projection optical system.

The focus state may be detected on the basis of a calculation of contrast of an image as imaged upon said photoelectric detector.

Said photoelectric detector may have an image pickup surface which is set in a best focus state with respect to the first object.

The focus state of the image pickup surface of said photoelectric detector with respect to the first object may be detected by moving an optical element disposed on a light path between the first object and the image pickup surface.

The focus state of the second object may be detected by moving one of the second object and the reference plate along an optical axis direction of the projection optical system.

In accordance with another aspect of the present invention, there is provided a projection exposure apparatus having a position detecting system as recited above, for aligning a reticle as the first object and a wafer as the second object with each other, and for printing a pattern of the reticle on the wafer through projection exposure.

In accordance with a further aspect of the present invention, there is provided a device manufacturing method using a position detecting system as recited above, for aligning a reticle as the first object and a wafer as the second object with each other, and for printing a pattern of the reticle on the wafer through projection exposure.

In accordance with a yet further aspect of the present invention, there is provided a photoelectric detecting system for detecting an article being illuminated with light, by use of a photoelectric detector, comprising: a pulse light source for emitting pulse light for illuminating the article; and control means for controlling the number of pulses of pulse light for illumination of the article, in the photoelectric detection of the illuminated article with the photoelectric detector.

The control of the pulse number may be made by changing the number of pulse emissions within a taking-in time of the said photoelectric detector.

The control of pulse number may be made by changing a taking-in time of said photoelectric detector.

In a position detecting system or a photoelectric detecting system according to the present invention, a light source provides pulse light wherein the number of pulses of light for the detection is adjusted so as to optimize the light quantity for the article to be detected. This enables high precision detection with a large dynamic range. Also, it minimizes interchanging in a light quantity adjusting device for adjustment of the light quantity within the detecting system. Thus, a high speed detecting system which minimizes a decrease of throughput is accomplished.

The present invention proposes a unique concept in the use of control of the pulse number, which is very effective to reduce the number of light quantity attenuating elements required. This effectively prevents enlargement of the detecting system and enlargement of a structure into which the detecting system is incorporated.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view of a conventional position detecting system.

FIGS. 4A and 4B show examples of a reticle alignment mark and wafer alignment mark.

FIG. 11 is a flow chart of a wafer process.

DESCRIPTION OF THE PREFERRED EMBODIMENTS

Figure 1:
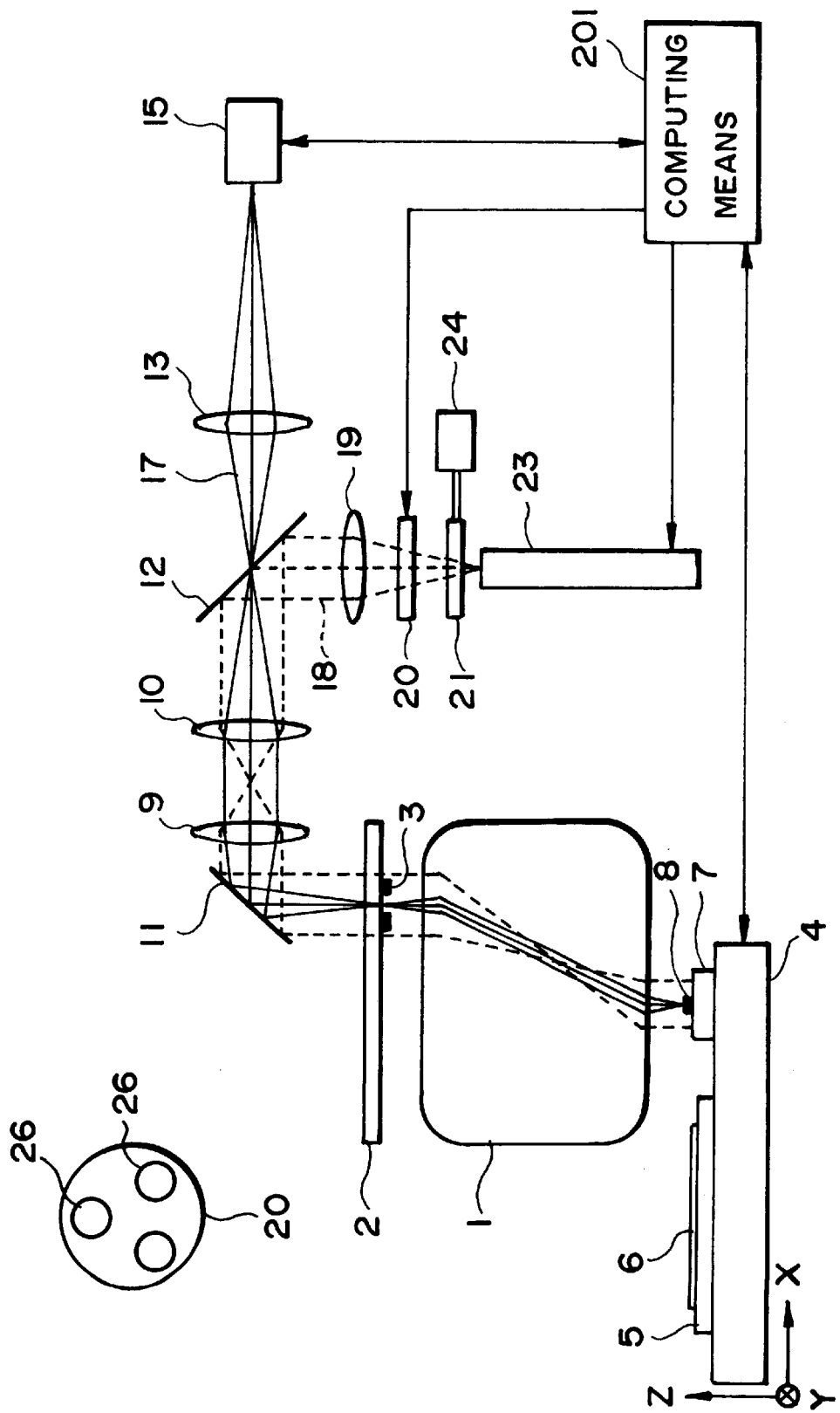
FIG. 1 is a schematic view of a position detecting system according to a first embodiment of the present invention.

FIG. 1 is a schematic view of a main portion of a semiconductor device manufacturing projection exposure apparatus into which a position detecting system according to the present invention is incorporated. Coordinate axes of X and Y are defined as illustrated. The position detecting system of the projection exposure apparatus includes position detecting optical systems in relation to the X and Y axes, respectively. Since they have equivalent structures, only the function of the position detecting system provided with respect to the X direction will be described below. It is to be noted here that, if the mark structure shown in FIGS. 4A and 4B is used, measurements both in the X and Y directions are attainable only with the position detecting system provided with respect to the X direction.

In FIG. 1, light emitted from a light source 23 such as an excimer laser, for example, for providing pulse light is directed by means of various optical systems (such as lenses or mirrors), not shown, to a diffusing plate 21. The diffusing plate 21 is held by a driving mechanism 24 and is swingingly moved thereby with respect to time and space, by which the effect of speckle peculiar to laser light is removed. Since the effect of speckle can be removed by changing the relative position of the diffusing plate 21 and the incidence position of light, the same advantageous result is attainable by swingingly moving the light which is going to be incident on the diffusing plate 21, in place of swinging the diffusing plate 21 with respect to time and space as in the present embodiment. Alternatively, an optical element having a similar effect as the diffusing plate 21 may be used, or the diffusing plate 21 may be disposed at a different position inside the position detecting optical system.

The light passed through the diffusing plate 21 is directed to a light quantity attenuator 20 such as an ND filter. As regards the position of the attenuator 20, it may be placed at any position within the position detecting optical system. The light passing through the attenuator 20 goes through an illumination optical system 19 of the position detecting system to a beam splitter 12, by which it is reflected toward a detection optical system 9 and 10. The beam splitter 12 may be provided by a polarization beam splitter and, on that occasion, an S component perpendicular to the sheet of the drawing is reflected toward the detection optical system. Here, a quarter waveplate (not shown) may be disposed within the detection optical system, by which the detection light can be directed efficiently to a photoelectric detector (hereinafter, "photoelectric converting element") 15.

The light passing through the detection optical system 9 and 10 then Koehler-illuminates a reticle alignment mark 3 provided on the pattern bearing surface of a reticle 2. The light (hereinafter, "reticle signal light") as reflected, scattered or diffracted by the illuminated reticle alignment mark 3 goes back to the detection optical system 9 and 10. The reticle signal light goes through the detection optical system 9 and 10 and, now, it passes through the beam splitter 12. Then, by means of an imaging optical system 13, an image of the reticle alignment mark 3 is imaged upon the tube surface (image pickup surface) of the photoelectric converting element 15.

On the other hand, light impinging on a portion other than the mark pattern region of the reticle alignment mark 3 passes through the reticle 2, and then it goes through a projection optical system 1. Thereafter, it Koehler-illuminates a wafer alignment mark 8 which is provided on a wafer 6 or on a reference plate 7 mounted on a wafer stage 4. From the thus illuminated wafer alignment mark 8, reflected light, scattered light or diffracted light is similarly produced, which light goes back through the projection optical system 1, such that an image of the wafer alignment mark 8 is imaged by the projection optical system 1 on the surface of the reticle.

As regards the imaging position of the wafer alignment mark 8, due to the imaging relation, it is in a portion (of the reticle alignment mark 3) other than the mark pattern region of the reticle alignment mark 3. The light from the wafer alignment mark 8, passing through this portion, is imaged upon the tube surface (image pickup surface) of the photoelectric converting element 15, in a similar manner as the reticle alignment mark 3.

With the structure described above, images of the reticle alignment mark 3 and the wafer alignment mark 8 are simultaneously imaged upon the photoelectric converting element 15, and they are photoelectrically detected. On the basis of this, the relative position of them is calculated. A calculation of the relative position is performed by calculating means 201 on the basis of a signal from the photoelectric converting element 15 and the position of the wafer stage 4. In accordance with the thus calculated relative position, the wafer stage 4 is moved by driving means (not shown), and superposed exposure is performed.

As described in the introduction of this specification, generally, in the position detection such as above, images of the reticle alignment mark 3 and wafer alignment mark 8 upon the photoelectric converting element 15 are different in brightness. For example, as compared with the reticle alignment mark 3, the light from the wafer alignment mark 8 is smaller in quantity because it passes through the projection optical system 1 twice, for illumination and detection. For this reason, as compared with the reticle alignment mark 3, the image of the wafer alignment mark 8 is detected with lower brightness. In consideration of this, in order to assure good precision detection both for the reticle alignment mark 3 and the wafer alignment mark 8 with the photoelectric converting element 15, the light quantity attenuator 20 has to be driven by means of a driving system 24 to provide an optimum light quantity. The light quantity attenuator 20 may comprise, for example, a plurality of ND filters 26 mounted on a rotatable rotary plate. It serves to change the light quantity by changing, through rotation, the ND filters to be inserted to the optical axis.

The optimum light quantity for the photoelectric detection may be that the detection light quantity of the reticle alignment mark 3 is not saturated and, also, the detection light quantity of the wafer alignment mark is high as much as possible. A light source of a pulse light emission type, such as an excimer laser, may be used, by which light quantity adjustment of high precision and a large dynamic range is attainable through adjustment of the number of pulses of light within the taking-in time of the photoelectric converting element 15. Therefore, in the embodiment of FIG. 1, the computing means 201 calculates the optimum pulse number on the basis of the image brightness as calculated through the photoelectric converting element 15. Then, in accordance with the result of the calculation, the laser device is controlled to adjust the pulse number in the position measurement operation, whereby the light quantity adjustment is performed. Practically, the reticle alignment mark 3 does not always have a higher brightness than the wafer alignment mark 8, and the brightness to be calculated is based on the maximum value of the detection signal light quantity.

Figure 2:
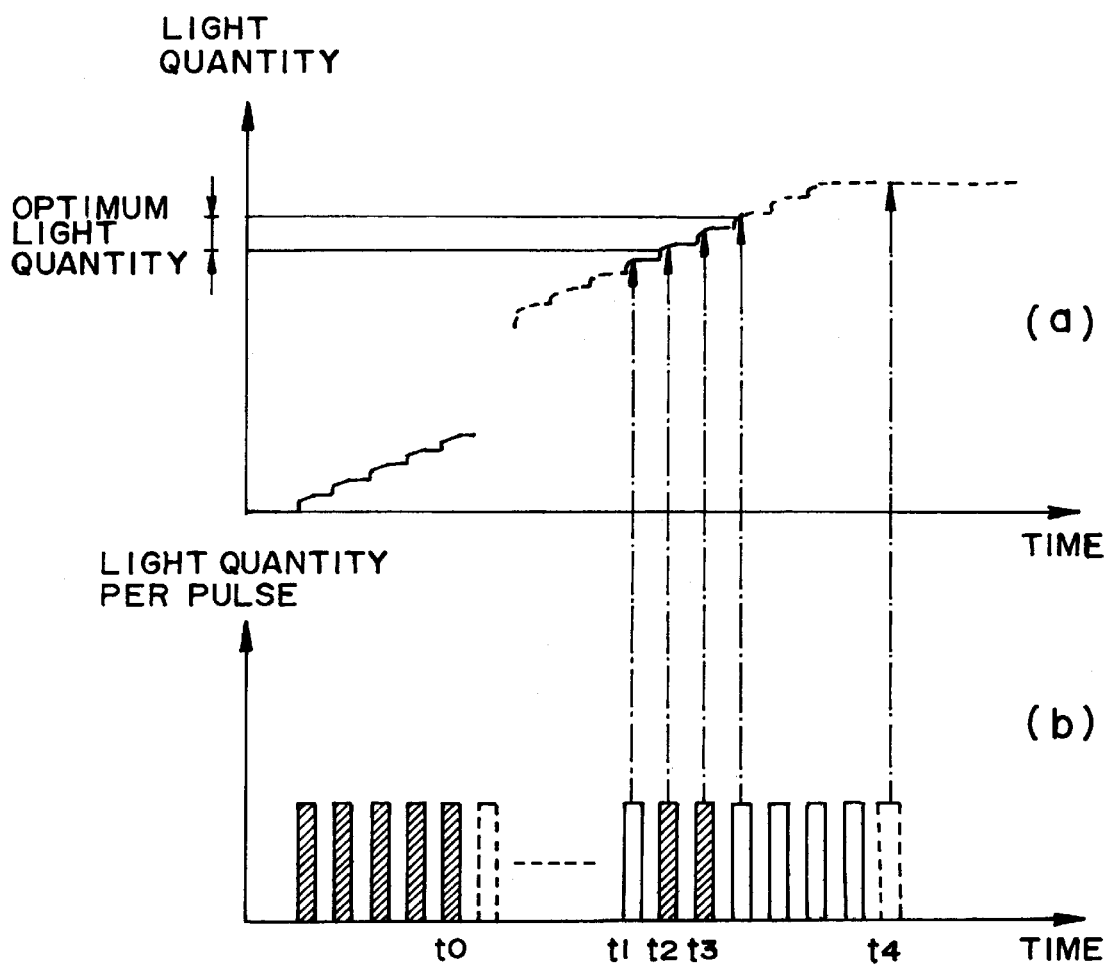
FIG. 2 is a schematic view for explaining the relation between a detection light quantity and a pulse number.
Figure 5A:
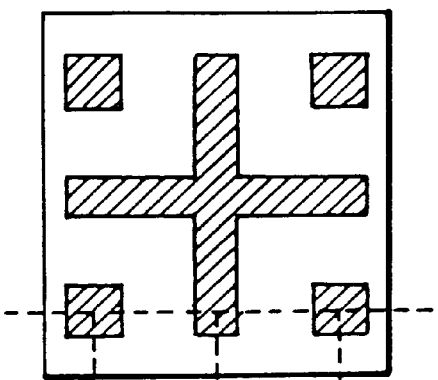
FIGS. 5A through 5D are schematic views for explaining signal waveforms detected with respect to the reticle alignment mark and the wafer alignment mark.
Figure 5B:
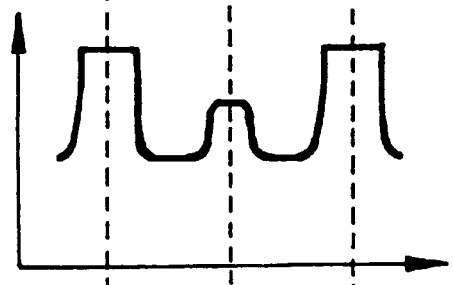
Figure 5C:
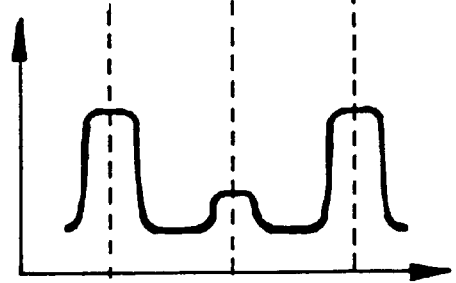
Figure 5D:
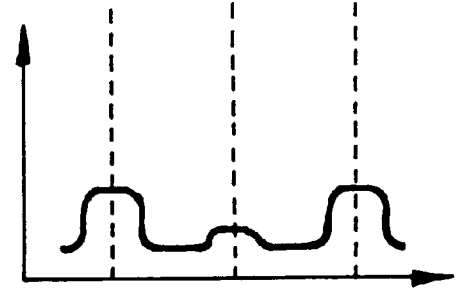

FIG. 2 illustrates the relation between the laser pulse and the detection signal light quantity (maximum value) to be detected by the photoelectric converting element 15. FIG. 2 in (a) schematically shows changes, with respect to time, of the maximum value of the detection signal intensity provided by the pulse light emission of the light source. FIG. 2 in (b) schematically shows the pulse light emission with respect to time.

As shown in (a) of FIG. 2, if the pulse number is made larger, the detection light quantity increases in proportion thereto. On the other hand, the optimum light quantity for signal detection has a certain range, and the pulse number should be adjusted so that the quantity comes into that range. In the case of FIG. 2 at (a), to attain the optimum light quantity, the pulse number may preferably be between t2 to t3. Namely, with a pulse number less than t1, the light quantity is low and, as a result, the detection signal of the wafer alignment mark 8 cannot be detected with good precision. If the pulse number is made larger than t4, then the detection light quantity is saturated, such that the precision of detection of the reticle alignment mark 3 is degraded. Good precision position detection is, therefore, attainable with a pulse number in the range from t2 to t3.

As regards the control of the pulse number, the computing means 201 supplies a signal to the laser device to cause the same to emit pulses of light of an optimum number which can be determined beforehand. Also, the computing means 201 supplies a trigger signal to the photoelectric converting element 15, for synchronization with the timing of taking-in the photoelectric signal. At the same time as the trigger signal is applied to the.photoelectric converting element 15, a laser light emission trigger signal is supplied by which the light emission is made in synchronism therewith. At the moment as pulse light of a desired pulse number is emitted, a light emission stop signal is applied to the laser device. With the procedure described above, position measurement with a desired number of pulses is accomplished.

Adjustment of the detection light quantity based on the laser pulse number is effective to reduce the frequency of mechanically changing the light quantity attenuator 20 and also to reduce the time necessary for the changing. Further, it is effective to reduce the number of types of attenuation by the attenuator 20.

If, as a typical example, the laser pulse frequency is 1 KHz and the taking-in time of the photoelectric converting element 15 is 20 ms (milliseconds), pulses of a number 20 at the maximum can be taken in with a single taking-in procedure. However, if laser light is used as a light source, it is necessary to take into account the possibility of speckle produced in the image to be formed on the photoelectric converting element 15, causing noise in the image. In order to reduce the effect of speckle, it is necessary to use the diffusing plate 21 described above, for example, to average the speckle with respect to time or space upon the imaging plane. This means that, in order to remove the adverse effect of speckle, pulses to a certain number have to be provided within the taking-in time. In the case of FIG. 2 at (b), for example, pulses of a number not less than t0 are required. In this case, the pulse number to be selected may be selected so that it is not less than a minimum pulse number with which the speckle can be removed.

Here, if it is assumed that the minimum pulse number necessary for removing the effect of speckle is 10 pulses, since 20 pulses at the maximum can be taken in, the range of light quantity adjustment based on the pulse number is 50%. Therefore, assuming that the range of the light quantity which can be measured is 70% and if the light quantity adjustment is performed by use of the combination of the pulse number and ND filters, the ND filters required are three types of filters of 100%, 34% and 12%, only. Clearly, this is a significant advantage over the structure of light quantity attenuator 20 described in the introduction of this specification, which needs nine types of ND filters.

As described hereinbefore, when a pulse light emission laser is used as a light source and through the light adjustment by pulse number control, the number of types of attenuation by the light quantity attenuator 20 of the position detecting optical-system in the position detecting system can be reduced effectively.

Since, in the present embodiment the light adjustment by pulse number control is made on the basis of the maximum level of the detection light quantity, high precision and high speed position detection is attainable. The necessity of changing the light quantity attenuator is reduced, and an undesirable decrease of throughput can be prevented or suppressed.

Figure 6:
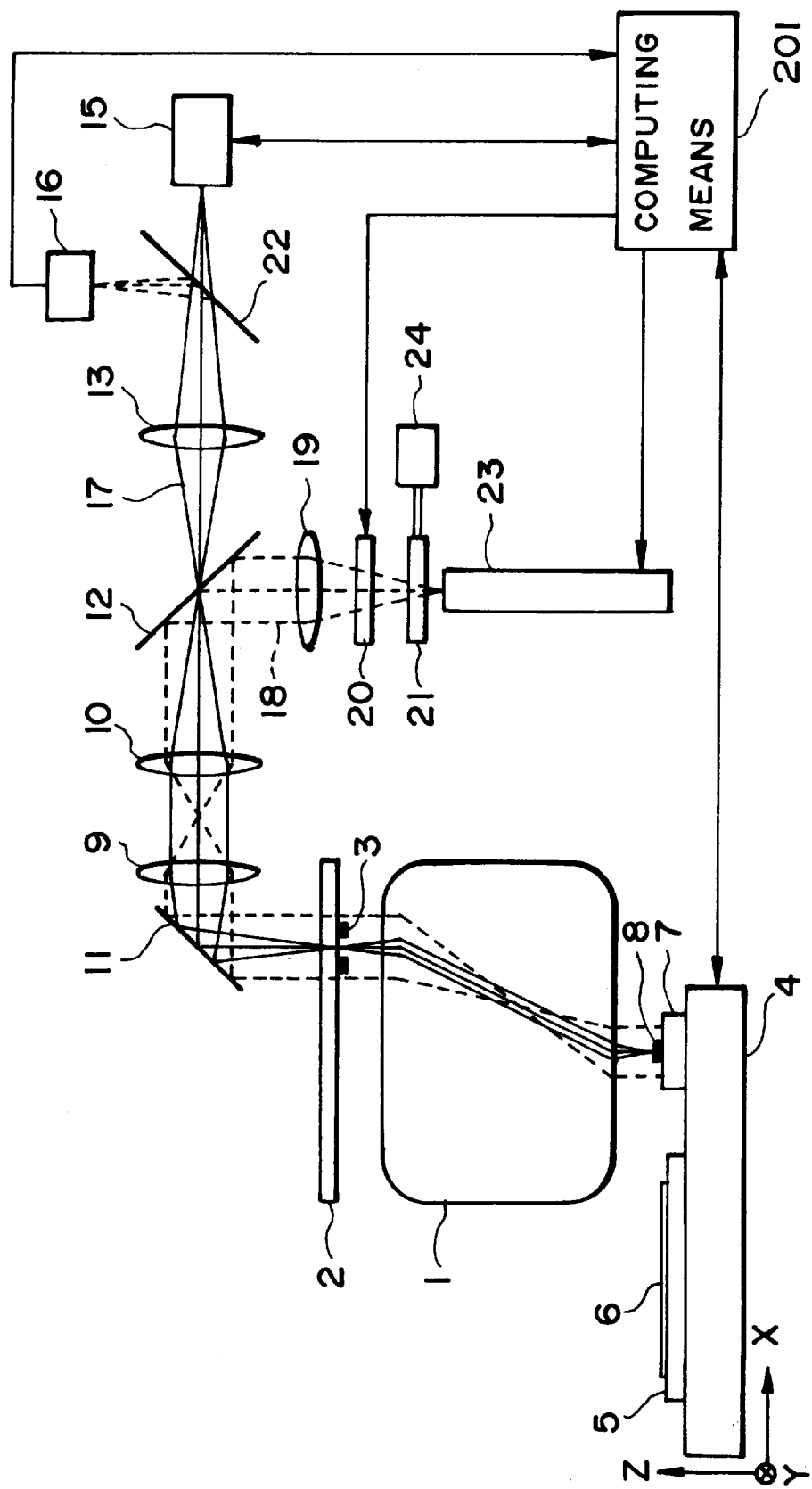
FIG. 6 is a schematic view of a position detecting system according to a second embodiment of the present invention.

FIG. 6 shows a second embodiment of the present invention. In this embodiment, the position detecting optical system has a similar structure as that of the first embodiment, and like reference numerals are assigned to those components having similar effects or functions. A duplicate description for common features will be omitted here, and only distinctive features will be explained.

Like the first embodiment, detection light 17 from a reticle alignment mark 3 and a wafer alignment mark 8 passes through a beam splitter 12 and, after this, it enters an imaging optical system 13. In this embodiment, as a feature thereof, a beam splitter 22 is disposed before a first photoelectric converting element 15. By this beam splitter 22, a portion of the detection light is reflected and it is projected on a second.photoelectric converting element 16. Light passing through the beam splitter 22 impinges on the first photoelectric converting element 15 as in the first embodiment, and similarly the relative position of the reticle alignment mark 3 and the wafer alignment mark 8 is performed.

The photoelectric converting element 16 serves to detect only the light quantity of light impinging thereon. As for the photoelectric converting element 16, any element may be used provided that it is operable to detect an absolute value of the detection light quantity and, also, the light quantity of every single laser pulse. The element 16 functions to monitor the light quantity to estimate the light quantity upon the first photoelectric converting element 15.

Since the second photoelectric converting element 16 can detect the total quantity of detection light, it is particularly effective in a case where a mark to be measured is limited or in a case where the type of mark and the brightness of the image to be detected on the first photoelectric converting element 15 are predetected. The light quantity during measurement with the second photoelectric converting element 16 can be measured in real time and, by utilizing this, the timing whereat the light quantity upon the first photoelectric converting element 15 becomes optimum can be determined.

FIG. 2 illustrates light quantity adjustment in the present invention. In FIG. 2 at (a), when the light quantity on the axis of the ordinate, which represents the output from the second photoelectric converting element 16, comes into the optimum light quantity range, it is concluded that an optimum light quantity is provided also on the first photoelectric converting element 15. Thus, if changing the light quantity attenuator 20 is not necessary, the light quantity of the detection light 17 is monitored and, at the moment where pulses of light providing the optimum light quantity are emitted, the computing means 201 applies a signal to the laser device to interrupt the light emission. Since the laser light emission is stopped in response to this signal, the position detection is accomplished with a desired number of light pulses.

With the provision of the second photoelectric converting element 16 in the position detecting optical system as described above, laser light emission can be controlled in real time to provide pulses of an optimum pulse number, without plural measurements of brightness upon the first photoelectric converting element 15. Therefore, the relative position of the reticle alignment mark 3 and the wafer alignment mark 8 can be detected at a higher speed and with an optimum light quantity.

Although FIG. 6 shows an example wherein the beam splitter 22 and the second photoelectric converting element 16 are disposed after the imaging optical system 13, the element 16 may be placed at any position provided that the information on the light quantity of the detection light 17 can be detected. For example, the beam splitter 22 and the second photoelectric converting element 16 may be disposed between the beam splitter 12 and the imaging optical system 13, with similar advantageous results.

Figure 7:
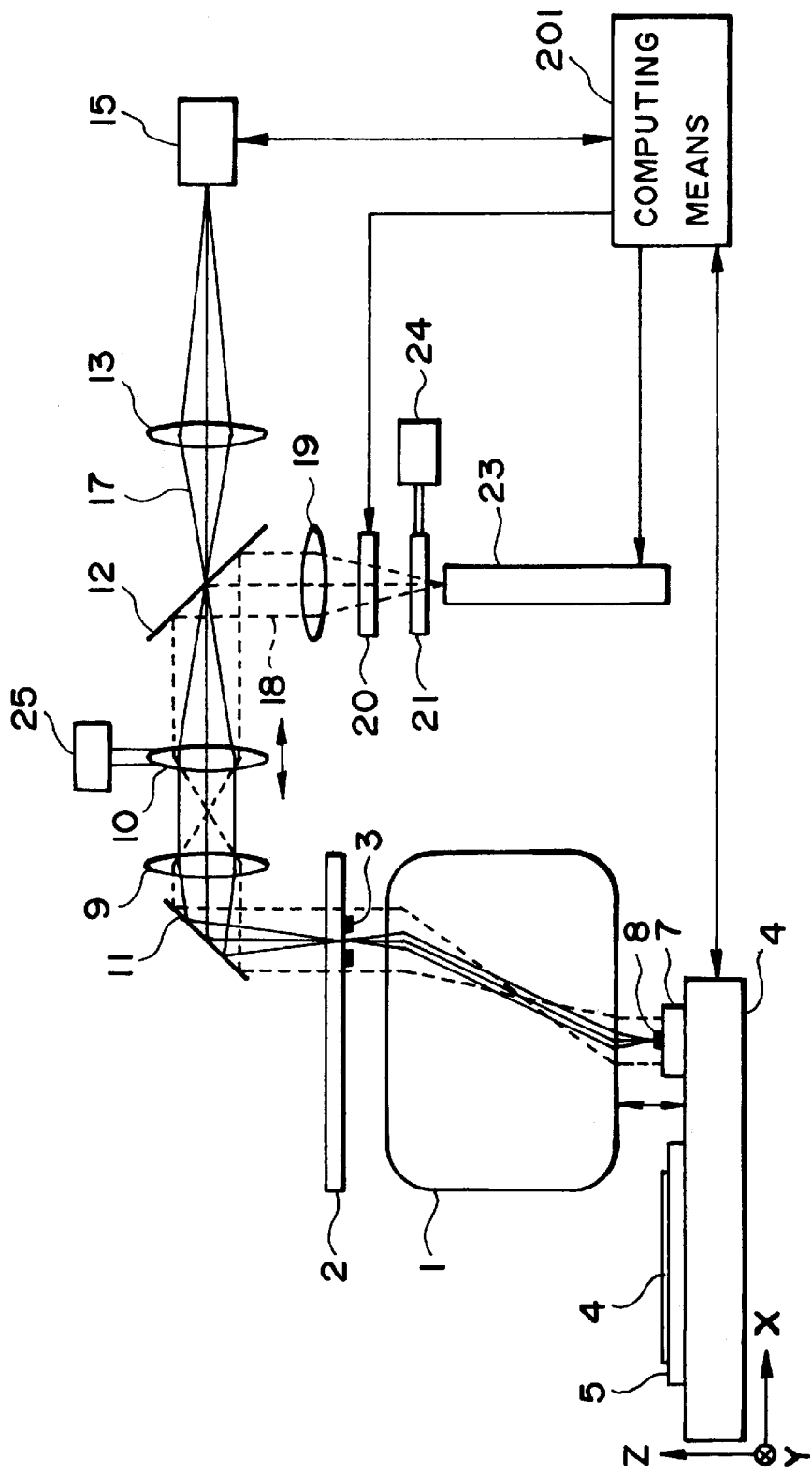
FIG. 7 is a schematic view of a position detecting system according to a third embodiment of the present invention.

FIG. 7 shows a third embodiment of the present invention, wherein measurement is made to the position, in an optical axis direction, of a conjugate plane (imaging plane) of a reticle pattern, on the wafer side, with respect to a projection optical system 1. Again, the position detecting optical system of this embodiment has a similar structure as that of the first embodiment, and like reference numerals are assigned to those elements having similar effects or functions. A duplicate description for common features will be omitted, and only distinctive features will be explained.

Detection optical system 9 and 10 of FIG. 7 comprises a telecentric optical system. The position of the optical system 10 can be optimized by moving the optical system 10 (hereinafter, "relay lens") in an optical axis direction of the detection optical system by means of a driving mechanism 25, such that an image of a reticle alignment mark 3 upon the reticle surface can be imaged on a photoelectric converting element 15 satisfactorily. The optimization is made on the basis of calculation of contrast of the reticle alignment mark 3 being observed through the photoelectric converting element 15.

Figure 8:
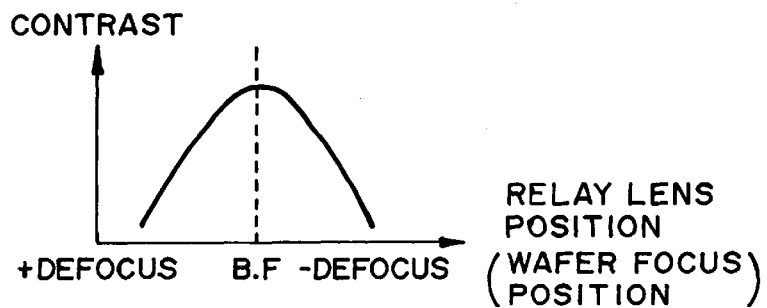
FIG. 8 is a schematic view for explaining changes of detected image contrast with a shift of focus.

FIG. 8 illustrates the relation between the position of the relay lens in the optical axis direction and variation in contrast of the image of the reticle alignment mark 3 observed through the photoelectric converting element 15. The image contrast becomes maximum, as the conjugate plane (best focus plane) of the reticle alignment mark 3 (reticle pattern surface) comes upon the tube surface of the photoelectric converting element 15. Namely, by calculating the contrast of reticle alignment mark 3 in regard to different relay lens positions while moving the relay lens 10, setting of the best focus plane position of the detection optical system with respect to the reticle can be performed.

After moving the relay lens 10 to the thus detected best focus position, then a note is paid to an image of the wafer alignment mark 8 upon the photoelectric converting element 15. Similar to the reticle alignment mark 3, the image contrast of the wafer alignment mark 8 varies with the position of the detection optical system with respect to the focus direction. The detection optical system has been set in the best focus state with respect to the reticle alignment mark 3, as described hereinbefore. The focus detection to the wafer alignment mark 8 is performed on the basis of contrast calculation to a detection image while moving the wafer stage 4 in an upward or downward direction which is along the optical axis direction of the projection optical system.

The best focus plane can be determined on the basis of the image contrast, in a similar procedure as for the reticle alignment mark 3. Since the best focus detection is made at the same detection position as the reticle alignment mark 3, the focus position of the wafer alignment mark 8 coincides with the conjugate plane of the reticle pattern surface with respect to the projection optical system. The wafer stage 4 is moved toward the thus detected focus position to bring the wafer (photosensitive substrate) surface thereto, and the exposure operation is performed. This accomplishes exposure at the best focus position.

In the focus position measurement described above, good precision measurement is not attainable unless contrast calculation is performed at an optimum brightness of an image to be taken in. Also, in regard to focus position measurement, adjustment of light based on variable control of the pulse number within the taking-in time of the photoelectric converting element 15, as has been described with reference to the first embodiment, is effective to reduce the number of types of attenuation of the light quantity attenuator 20 provided in the position detecting optical system.

Since, in the present embodiment, the light adjustment by pulse number control is made on the basis of the maximum level of detection light quantity, high precision and high speed focus position detection is attainable, with a large dynamic range. Further, an undesirable decrease of throughput can be prevented or suppressed.

Figure 9A:
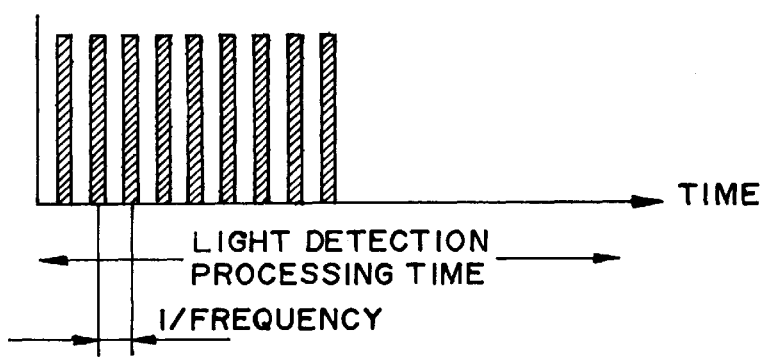
FIGS. 9A–9C are schematic views, respectively, for explaining a basic concept of a fourth embodiment of the present invention.
Figure 9B:
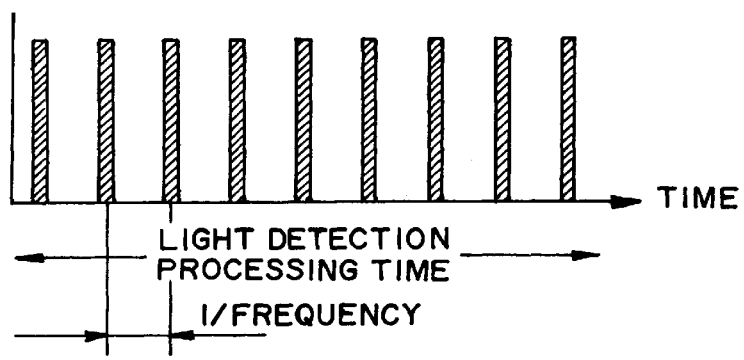
Figure 9C:
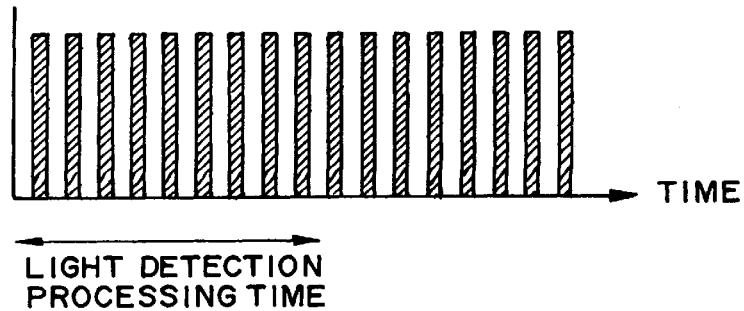

FIGS. 9A–9C show a fourth embodiment of the present invention, and illustrate other light adjusting methods based on pulse number control. The axis of the abscissa denotes a taking-in time of a photodetector, and the axis of the ordinate denotes emission of light pulses. In the position detecting system according to this embodiment, as a feature thereof, brightness is adjusted by changing the pulse number within the taking-in time. FIG. 9A illustrates a method corresponding to the first embodiment, in which the taking-in time of the photodetector and the frequency of pulse light are held fixed, while the pulse light emission is interrupted in response to pulses of a predetermined number. In FIG. 9A, during the taking-in time, the pulse light emission is interrupted at nine pulses, for light adjustment.

FIG. 9B shows a method in which the taking-in time of the photodetector is held fixed while the frequency of pulse light is changed so that pulses of a predetermined number are taken in. In FIG. 9B, the spacings of the pulses (columns) correspond to the frequency. By changing the spacings (frequency), pulses of a predetermined number (nine pulses) are taken in. FIG. 9C shows a method in which the frequency of pulse light is held fixed. More specifically, the light emission frequency is held at the highest frequency of the light source itself and, at the moment as the pulses of a predetermined number (nine pulses) are emitted, the taking-in of the photodetector is interrupted. In this example, since the frequency of the light source is held at the maximum while the taking-in time is changed, it provides an advantageous effect of reduction in measurement time.

As described above, the pulse number within the taking-in time of the photodetector can be changed in various ways, and selection may preferably be made while taking into account the property or characteristic of a light source or a photodetector to be used.

Next, an embodiment of a device manufacturing method using a projection exposure apparatus such as described above, will be explained.

Figure 10:
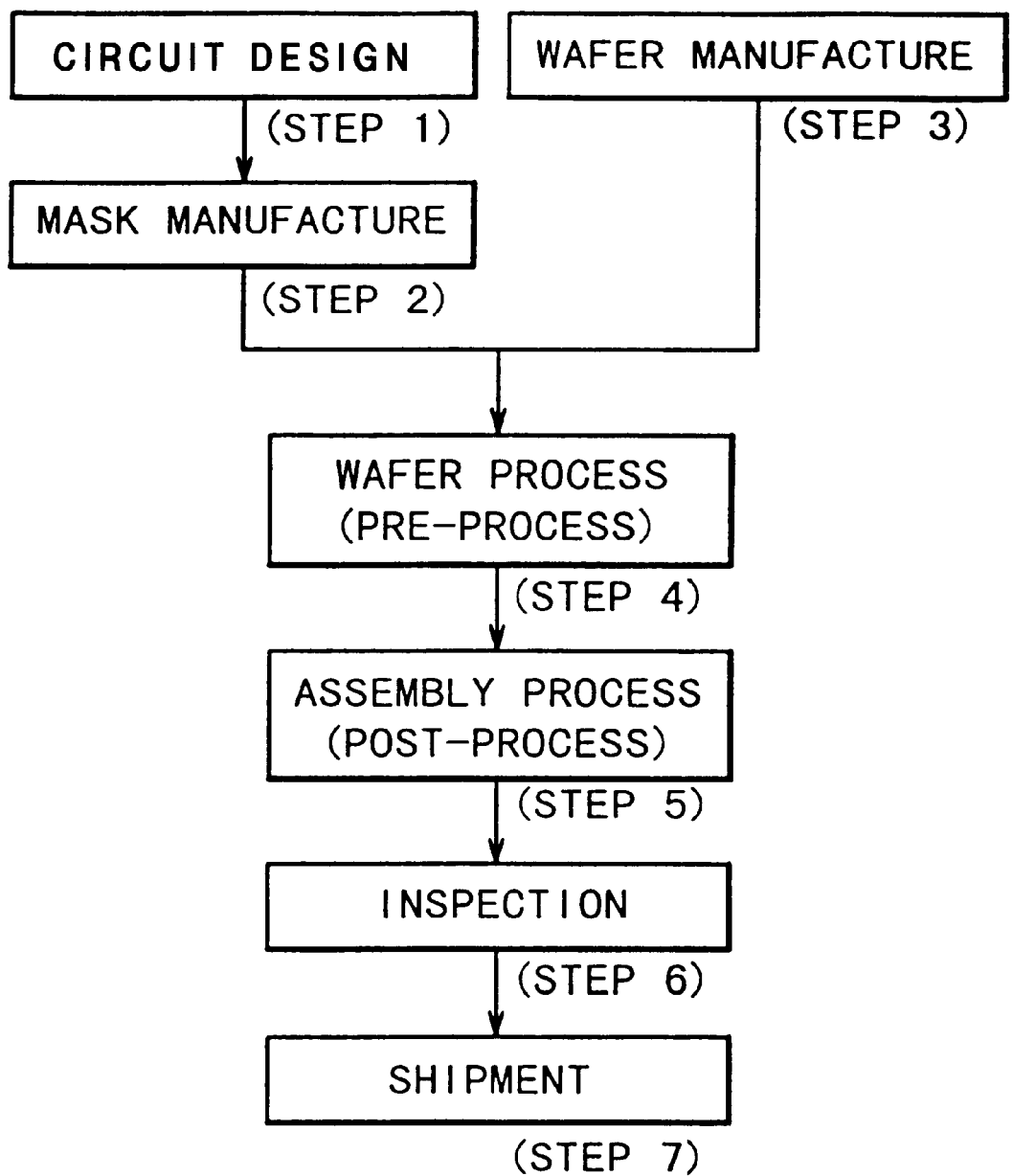
FIG. 10 is a flow chart of a device manufacturing method according to an embodiment of the present invention.

FIG. 10 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A position detecting system for detecting a relative position of first and second objects placed in an optically conjugate relation with respect to a projection optical system, said position detecting system comprising:

a pulse light source for emitting pulse light for illuminating a first mark provided on the first object and a second mark provided on one of the second object and a reference plate disposed at a position equivalent to that of the second object;

a photoelectric detector for photoelectrically detecting the first and second marks illuminated with the pulse light from said pulse light source; and control means for controlling the number of pulses of the pulse light from said pulse light source, in the photoelectric detection of the first and second marks through said photoelectric detector.

2. A position detecting system according to claim 1, wherein the number of pulses is not less than a minimum number of pulses with which no measurement error is produced in the relative position detection due to speckle to be produced by the pulse light.

3. A position detecting system according to claim 2, wherein said control means performs the control of the pulse number by changing a pulse light emission frequency within a taking-in time of said photoelectric detector.

4. A position detecting system according to claim 2, wherein said control means performs the control of the pulse number by changing a taking-in time of said photoelectric detector.

5. A position detecting system according to claim 4, further comprising an oscillator for oscillating said pulse light source, at a highest light emission frequency of said pulse light source, for changing the taking-in time.

6. A position detecting system according to claim 2, further comprising light quantity adjusting means, separate from said control means, for adjusting light quantity, wherein s aid light quantity adjusting mean s is used in combination with the pulse number control through said control means.

7. A position detecting system according to claim 6, wherein said light quantity adjusting means comprises means for selecting desired ones from a plurality of ND filters.

8. A position detecting system according to claim 2, further comprising a monitoring photoelectric detector for monitoring a quantity of light to said photoelectric detector for photoelectrically detecting the first and second masks.

9. A position detecting system according to claim 7, wherein said control means performs the control of the pulse number on the basis of an output of said monitoring photoelectric detector.

10. A position detecting system according to claim 1, wherein the detection of the relative position relates to detection of an alignment state of the first and second objects with respect to the projection optical system.

11. A position detecting system according to claim 1, wherein the detection of the relative position relates to detection of a focus state of the first and second objects with respect to the projection optical system.

12. A position detecting system according to claim 11, wherein said photoelectric detector detects the focus state on the basis of a calculation of contrast of an image as imaged upon said photoelectric detector.

13. A position detecting system according to claim 12, wherein said photoelectric detector has an image pickup surface which is set in a best focus state with respect to the first object.

14. A position detecting system according to claim 13, wherein the focus state of the image pickup surface of said photoelectric detector with respect to the first object is detected by moving an optical element disposed on a light path between the first object and the image pickup surface.

15. A position detecting system according to claim 14, wherein the focus state of the second object is detected by moving one of the second object and the reference plate along an optical axis direction of the projection optical system.

16. A projection exposure apparatus having a position detecting system as recited in claim 1, for aligning a reticle as the first object and a wafer as the second object with each other, and for printing a pattern of the reticle on the wafer through projection exposure.

17. A device manufacturing method using a position detecting system as recited in claim 1, for aligning a reticle as the first object and a wafer as the second object with each other, and for printing a pattern of the reticle on the wafer through projection exposure.

18. A photoelectric detecting system for detecting a position of an article being illuminated with light, by use of a photoelectric detector, said system comprising:

a pulse light source for emitting pulse light for illuminating the article; and control means for controlling the number of pulses of pulse light for illumination of the article, in the photoelectric detection of the illuminated article with the photoelectric detector.

19. A photoelectric detecting system according to claim 18, wherein said control means Performs the control of the pulse number by changing the number of pulse emissions within a taking-in time of said photoelectric detector.

20. A photoelectric detecting system according to claim 18, wherein said control means controls the control of the pulse number by changing a taking-in time of said photoelectric detector.

* * * * *

UNITED STATES PATENT AND TRADEMARK OFFICE
CERTIFICATE OF CORRECTION

PATENT NO.    : 6,151,121
DATED         : November 21, 2000
INVENTOR(S)   : Kazuhiko Mishima It is certified that error appears in the above-identified patent and that said Letters Patent is hereby corrected as shown below:

Column 1:
Line 20, "technique" should read -- technique, --.
Line 53, "a" (second occurrence) should be deleted.

Column 9:
Line 30, "embodiment" should read -- embodiment, --.

Column 13:
Line 35, "s aid" should be -- said -- and "mean s" should read -- means --.

Column 14:
Line 45, "Performs" should read -- performs --.

Signed and Sealed this

Twenty-fifth Day of September, 2001

*Attest:*

NICHOLAS P. GODICI
*Attesting Officer*   Acting Director of the United States Patent and Trademark Office